(12) United States Patent
Zhang et al.

(10) Patent No.: US 10,902,970 B2
(45) Date of Patent: Jan. 26, 2021

(54) PATTERNED TRANSPARENT CONDUCTIVE FILM AND PROCESS FOR PRODUCING SUCH A PATTERNED TRANSPARENT CONDUCTIVE FILM

(71) Applicant: BASF SE, Ludwigshafen (DE)

(72) Inventors: Rui Zhang, West New York, NY (US); Garo Khanarian, Princeton, NJ (US); Herve Dietsch, Bad Duerkheim (DE)

(73) Assignee: BASF SE, Ludwigshafen (DE)

( * ) Notice: Subject to any disclaimer, the term of this patent is extended or adjusted under 35 U.S.C. 154(b) by 143 days.

(21) Appl. No.: 15/566,228

(22) PCT Filed: Apr. 13, 2016

(86) PCT No.: PCT/EP2016/058101
§ 371 (c)(1),
(2) Date: Oct. 13, 2017

(87) PCT Pub. No.: WO2016/166148
PCT Pub. Date: Oct. 20, 2016

(65) Prior Publication Data
US 2018/0090239 A1  Mar. 29, 2018

Related U.S. Application Data

(60) Provisional application No. 62/148,241, filed on Apr. 16, 2015.

(51) Int. Cl.
| | | |
|---|---|---|
| *H01B 1/22* | (2006.01) | |
| *H01L 51/00* | (2006.01) | |
| *B05D 1/26* | (2006.01) | |
| *B05D 1/28* | (2006.01) | |
| *B05D 3/04* | (2006.01) | |
| *H01B 13/00* | (2006.01) | |
| *B82Y 30/00* | (2011.01) | |

(52) U.S. Cl.
CPC ............... *H01B 1/22* (2013.01); *B05D 1/26* (2013.01); *B05D 1/28* (2013.01); *B05D 3/0466* (2013.01); *H01B 13/0036* (2013.01); *H01L 51/0023* (2013.01); *B82Y 30/00* (2013.01); *G06F 2203/04103* (2013.01)

(58) Field of Classification Search
CPC .... H01B 1/22; H01B 13/0036; B05D 3/0466; B05D 1/28; B05D 1/26
USPC .......................................................... 428/323
See application file for complete search history.

(56) References Cited

U.S. PATENT DOCUMENTS

| | | | | |
|---|---|---|---|---|
| 7,527,853 B2 * | 5/2009 | Asai | ......................... | C08J 7/042 428/212 |
| 8,018,568 B2 | 9/2011 | Allemand et al. | | |
| 2007/0074316 A1 | 3/2007 | Alden et al. | | |
| 2013/0078436 A1 * | 3/2013 | Naito | ..................... | H05B 33/28 428/196 |
| 2013/0319729 A1 * | 12/2013 | Poon | ..................... | H05K 1/0296 174/250 |
| 2014/0158987 A1 * | 6/2014 | Song | ........................ | H05K 1/09 257/29 |
| 2015/0008016 A1 | 1/2015 | Poon | | |
| 2015/0014025 A1 | 1/2015 | Poon | | |
| 2015/0162112 A1 | 6/2015 | Poon | | |
| 2015/0235728 A1 | 8/2015 | Poon | | |
| 2018/0113529 A1 * | 4/2018 | Shingai | ..................... | B32B 9/00 |
| 2018/0291498 A1 * | 10/2018 | Chan | ........................ | C25D 5/54 |
| 2019/0171311 A1 * | 6/2019 | Gaynor | ............. | H01B 13/0013 |
| 2019/0388933 A1 * | 12/2019 | Toba | ..................... | H01B 13/22 |
| 2020/0161017 A1 * | 5/2020 | Alden | ..................... | H01B 1/22 |

FOREIGN PATENT DOCUMENTS

WO   WO 2013/095971 A   6/2013

OTHER PUBLICATIONS

International Search Report and Written Opinion of the International Searching Authority dated Jun. 27, 2016 in PCT/EP2016/058101 filed Apr. 13, 2016.
International Preliminary Report on Patentability dated Jun. 12, 2017 in PCT/ EP2016/058101 filed Apr. 13, 2016.
Christina Graf, et al., "A General Method to Coat Colloidal Particles with Silica" Langmuir, vol. 19, No. 17, 2003, pp. 6693-6700.
Yadong Yin, et al. "Silver Nanowires Can Be Directly Coated with Amorphous Silica to Generate Well-Controlled Coaxial Nanocables of Silver/Silica" Nano Letters, vol. 2, No. 4, 2002, pp. 427-430.

* cited by examiner

*Primary Examiner* — Jane L Stanley
(74) *Attorney, Agent, or Firm* — Oblon, McClelland, Maier & Neustadt, L.L.P.

(57) ABSTRACT

The invention relates to a patterned transparent conductive film, comprising areas with higher conductivity and areas with lower conductivity, wherein in the areas with higher conductivity nanoobjects are disposed in a binder matrix such that the nanoobjects are interconnected and thereby form an area with higher conductivity and wherein in the areas with lower conductivity the nanoobjects are structurally intact and are coated with an insulating coating material. The invention further relates to a process for producing such a patterned transparent conductive film comprising areas with lower conductivity and areas with higher conductivity, comprising following steps: (a) applying an ink comprising electrically conductive nanoobjects and a binder on a substrate, forming a first layer, wherein the amount of conductive nanoobjects is such that the first layer is conductive after drying; (b) drying of the first layer; (c) applying a mixture comprising an insulating coating material or a precursor of an insulating coating material on that parts of the first layer which shall form the areas with lower conductivity, wherein the insulating coating material or the precursors form an insulating coating around the electrically conductive nanowires; (d) drying of the coated substrate.

24 Claims, No Drawings

PATTERNED TRANSPARENT CONDUCTIVE FILM AND PROCESS FOR PRODUCING SUCH A PATTERNED TRANSPARENT CONDUCTIVE FILM

The invention relates to a patterned transparent conductive film, comprising areas with lower conductivity and areas with higher conductivity. The invention further relates to a process for producing such a patterned transparent conductive film comprising areas with lower conductivity and areas with higher conductivity.

Patterned transparent conductive films comprising a transparent conductive layer are used for example in flat liquid crystal displays, touch panels, electroluminescent devices, thin film photovoltaic cells, as anti-static layers, and as electromagnetic wave shielding layers.

The transparent conductive layers generally are composites, comprising an optically transparent contiguous solid phase and a conductive network of electroconductive nanoobjects which extend throughout the solid phase. The solid phase, also referred to as matrix, is formed of one ore more optically transparent polymers. The matrix binds the electroconductive nanoobjects within the layer, fills the voids between the electroconductive nanoobjects, provides mechanical integrity and stability to the layer and binds the layer to the surface of the substrate. The conductive network of electroconductive nanoobjects allows for flow of an electric current between adjacent and overlapping electroconductive nanoobjects within the layer. Due to the small dimensions of the nanoobjects, their influence on the optical behavior of the composite is quite small thus allowing for the formation of an optically transparent composite, i.e. a composite having a light transmission of 80% or more in the visible region (400 to 700 nm) measured according to ASTM D 1003.

A transparent conductive layer and a process for its production are disclosed for example in WO-A 2013/095971. For producing a transparent electrically conductor an electrically conductive layer is disposed onto a transparent substrate. The electrically conductive layer comprises a plurality of interconnecting metallic nanowires and a polymeric overcoat layer. In the electrically conductive layer a pattern is formed, wherein the pattern comprises areas with higher electrical conductivity which are separated by electrically insulating traces. The traces are produced by irradiation with a laser, wherein material of the electrically conductive layer is removed. Therefore, the traces are formed as valleys in the electrically conductive layer. The valleys have a depth in the range from 10 to 100 nm and a cross-sectional width in the range from 10 to 1000 µm. The valleys further comprise a plurality of crevices having a depth in the range from 50 to 100 nm.

Further transparent conductive layers comprising a polymer matrix and conductive nanowires are disclosed in US-A 2007/0074316 or U.S. Pat. No. 8,018,568. In the areas with higher conductivity the nanowires interconnect. The areas with lower conductivity are formed by etching or photopatterning by using photocurable matrix materials.

In these prior art the metal nanowires are completely or partially removed in the patterned areas. Therefore, the pattern may be visible. A disadvantage of the process as disclosed in WO-A 2013/095971 is that metal of the nanowires is vaporized and re-deposited on the edges of the spots irradiated by the laser, forming highly reflective dots or circles of tens of microns sizes.

Therefore, there may be significant changes in haze, transparency and reflectance in the irradiated regions which means that the pattern also may be visible.

From C. Graf et al, A General Method To Coat Colloidal Particles with Silica, Langmuir 2003, Vol. 19, pages 6693 to 6700 or Y. Yin et al, Silver Nanowires Can Be Directly Coated with Amorphous Silica To Generate Well-Controlled coaxial Nanocables of Silver/Silica, Nano Letters, 2002, Vol. 2, No. 4, pages 427 to 430 it is known to coat Nanowires or Nanoparticles with silica. However, these processes are only used for nanoobjects which are not embedded in a polymeric matrix.

Therefore, it is an object of the present invention to provide a transparent conductive layer in which the pattern is not visible and the nanoobjects are not removed in the patterned areas. It is a further object of the present invention to provide a process for producing such a transparent conductive layer.

This object is achieved by a patterned transparent conductive film, comprising areas with higher conductivity and areas with lower conductivity, wherein in the areas with higher conductivity nanoobjects are disposed in a binder matrix such that the nanoobjects are interconnected and thereby form an area with higher conductivity and wherein in the areas with lower conductivity the nanoobjects are structurally intact and are coated with an insulating coating material.

The further object is achieved by a process for producing such a patterned transparent conductive film comprising areas with higher conductivity and areas with lower conductivity, comprising following steps:

(a) applying an ink comprising electrically conductive nanoobjects and a binder on a substrate, forming a first layer, wherein the amount of conductive nanoobjects is such that the first layer is conductive after drying;
(b) drying of the first layer;
(c) applying a mixture comprising an insulating coating material or a precursor of an insulating coating material on that parts of the first layer which shall form the areas with lower conductivity, wherein the insulating coating material or the precursors form an insulating coating around the electrically conductive nanowires;
(d) rinsing and drying of the coated substrate.

By applying the mixture comprising an insulating coating material or a precursor thereof, it is possible to coat the nanoobjects in the dried first layer. By the coating, the nanoobjects are insulated and therefore the electron transportation between the nanoobjects is reduced or preferably stopped. After the coating, the nanoobjects remain structurally intact. Further, the number density of the nanoobjects is substantially the same in the areas with higher conductivity and the areas with lower conductivity. Therefore, the optical characteristics of the patterned transparent conductive film do not significantly change and the patterns are not visible.

"Structurally intact" means that the nanoobjects in the areas with lower conductivity have the same structure as in the area with higher conductivity and are not broken for forming the areas with lower conductivity.

The substrate onto which the patterned transparent conductive film is applied, generally also is optically transparent. The substrate preferably is made of glass, polycarbonate, polyethylene terephthalate, cyclic olefin polymer, polyimide, thermoplastic polyurethane or polymethyl methacrylate.

The areas with higher conductivity and the areas with lower conductivity are defined by their sheet resistance. The sheet resistance is a measure of resistance of a sheet namely uniform in thickness. The term "sheet resistance" implies that the current flow is along the plane of the sheet, not perpendicular to it. For a sheet having a thickness t, a length L and a width W, the resistance R is $$R = \rho \cdot \frac{L}{W \cdot t} = \frac{\rho}{t} \cdot \frac{L}{W} = R_{sh} \cdot \frac{L}{W}$$

wherein $R_{sh}$ is the sheet resistance. Accordingly the sheet resistance $R_{sh}$ is $$R_{sh} = R \cdot \frac{W}{L}.$$

In the formula given above, the bulk resistance R is multiplied with a dimensionless quantity (W/L) to obtain the sheet resistance $R_{sh}$, thus the unit of sheet resistance is Ohm. For the sake of avoiding confusion with the bulk resistance R, the value of the sheet resistance is commonly indicated as "Ohm per Square" because in the specific case of a square sheet applies W=L and $R_{sh}$=R. The sheet resistance is measured for example by means of a four point probe.

In a preferred embodiment, the ratio of sheet resistance in the areas with lower conductivity and the areas with higher conductivity is larger than 1000. In a particular preferred embodiment, the ratio of sheet resistance in the areas with lower conductivity and the areas with higher conductivity is larger than 10000. The sheet resistance of the areas with lower conductivity preferably is larger than 100,000 ohms per square (OPS), more preferred larger than 1,000,000 OPS, and particularly larger than 10,000,000 OPS. The sheet resistance of the areas with higher conductivity preferably is smaller than 1000 OPS, more preferred in the range from 5 to 500 OPS, and particularly in the range from 10 to 100 OPS.

To achieve a non-visible patterned transparent conductive film, the difference in light transmission of the areas with lower conductivity and the areas with higher conductivity preferably is less than 5%. Particularly preferred, the difference in light transmission of the areas with lower conductivity and the areas with higher conductivity is less than 0.5%. The light transmission refers to the percentage of an incident light which is transmitted through a medium. The light transmission of the areas with higher conductivity according to the invention is at least 80%, measured according to ASTM D 1003 (Procedure A). More preferred, the light transmission is at least 85%, further preferably at least 90% and particularly preferably at least 95%, in each case measured according to ASTM D 1003 (Procedure A).

The difference in haze of the areas with lower conductivity and the areas with higher conductivity preferably is less than 0.5%. Particularly preferred the difference in haze is less than 0.1%. The haze of the areas with higher conductivity of the transparent conductive layer is preferably 2% or less, more preferably 1.8% or less, further preferably 1.5% or less and particularly preferably 1.2%, in each case measured according to ASTM D 1003 (Procedure A).

The measurement of haze and light transmission (in ASTM D 1003 referred to as luminous transmittance which is the ratio of the luminous flux transmitted by a body to the flux incident upon it) by means of a hazemeter is defined in ASTM D 1003 as "Procedure A—Hazemeter". The values of haze and light transmission (corresponding to the luminous transmittance as defined in ASTM D 1003) given in the context of the present invention refer to this procedure.

Generally haze is an index of the light diffusion. It refers to the percentage of the quantity of light separated from the incident light and scattered during transmission. It is typically caused by surface roughness, and by embedded particles or compositional heterogeneities in the medium.

According to ASTM D 1003, in transmission, haze is the scattering of light by a specimen responsible for the reduction in contrast of objects viewed through said specimen, i.e. the percent of transmitted light that is scattered so that its direction deviates more than a specified angle (2.5°) from the direction of the incident beam.

A nanoobject in regard to the present invention is an object having one, two, or three external dimensions in the nanoscale, i.e. in the size range from approximately 1 nm to 100 nm. The electrically conductive nanoobjects to be used for the present invention are electrically conductive nanoobjects having two external dimensions in the range from 1 nm to 100 nm and their third external dimension in the range from 1 µm to 100 µm. Typically, said two external dimensions which are in the range from 1 nm to 100 nm are similar, i.e. they differ in size by less than three times. The third dimension of the electrically conductive nanoobjects is significantly larger, i.e. it differs from the other two external dimensions by more than three times. Such nanoobjects also are referred to as nanofibers.

The electrically conductive nanoobjects used in the present invention are preferably nanowires or nanotubes. Nanowires are electrically conductive nanofibers, nanotubes are hollow nanofibers.

Electrically conductive nanoobjects used for the present invention typically have a cross section close to circular shape. Said cross section extends perpendicularly to said external dimension which is in the range of from 1 µm to 500 µm. Thus, said two external dimensions which are in the nanoscale are defied by the diameter of said circular cross section. Said third external dimension extending perpendicular to said diameter is referred to as the length.

Preferably, the electrically conductive nanoobjects have a length in the range from 1 µm to 500 µm, more preferably from 3 µm to 100 µm, and particularly preferably from 10 µm to 50 µm. The diameter of the electrically conductive nanoobjects preferably is in the range from 1 nm to 100 nm, more preferably from 2 nm to 50 nm, particularly preferably from 3 nm to 30 nm.

To provide a sufficient electrical conductivity, the electrically conductive nanoobjects are made of a metal or carbon. Preferably, the electrically conductive nanoobjects are made of silver, copper, gold, platinum, palladium, nickel or carbon. In case the electrically conductive nanoobjects are made of a metal, preferably silver, copper, gold, platinum, palladium, or nickel, the nanoobjects preferably are nanowires. In case the electrically conductive nanoobjects are made of carbon, the nanoobjects preferably are nanotubes. Particularly preferably, the nanoobjects are silver nanowires, gold nanowires or copper nanowires, particularly silver nanowires.

In the areas with higher conductivity of the transparent conductive layer, the nanoobjects are interconnected. The amount of nanoobjects is such that the interconnecting nanoobjects are in contact. Due to the contact of the nanoobjects, electric current can flow in the areas with higher conductivity.

Nanowires made of metals, for example silver nanowires, are typically commercially available in the form of an aqueous dispersion wherein polyvinylpyrrolidone is adsorbed onto the surface of the nanowires in order to render the dispersion stable. Any matter adsorbed on the surface of the nanowires is not included in the above-defined dimensions and composition of the electrically conductive nanoobjects.

To achieve a first layer which is conductive, the ink comprising electrically conductive nanoobjects which is applied in step (a) to form the first layer preferably comprises 0.01 to 1 wt %, preferably 0.05 to 0.5 wt % electrically conductive nanoobjects, 0.02 to 5 wt %, preferably 0.1 to 1.5 wt % binder and solvent.

The binder which is comprised in the ink forms the matrix of the first layer by drying. To provide an ink, which can be applied to the substrate, the solvent is selected such that the binder is soluble in the solvent or can be dispersed in the solvent as particles or fibers. As the nanowires are not soluble, the nanowires are dispersed in the solvent comprising the solved or dispersed binder. The binder is preferably selected from the group consisting of hydropropyl methyl cellulose, methyl cellulose, styrene(meth)acrylic copolymers, crystalline cellulose, poly(meth)acrylates, copolymers of acrylates and methacrylates, copolyers of styrene and (meth)acrylates, carboxymethyl cellulose, poly acrylamide, polyvinylalcohol, polyvinylpyrrolidone, polystyrenesulfonic acid, dextran or blends thereof.

The solvent preferably is water. However, if polymers are used as binder which are not soluble in water or cannot be dispersed in water as particles or fibers, the solvent preferably is an organic solvent. Preferably, the solvent is selected from the group consisting of alcohols, ketones, ethers, hydrocarbons or aromatic solvents. Suitable aromatic solvents are for example benzene, toluene ore xylene. Particularly preferred, however, the binder is selected from polymers which are water soluble and the solvent is water. In some cases the solvent can be a mixture of two or more miscible solvents, for example, water and isopropanol.

To apply the ink onto the substrate, any suitable printing process can be used. In a preferred embodiment, the ink comprising conductive nanowires and binder is applied by spin coating, draw down coating, roll-to-roll coating, gravure printing, microgravure printing, screen-printing, flexoprinting and slot-die coating.

Preferably, the ink is applied to the surface of the substrate in a thickness in a range of from 1 µm to 200 µm, preferably of from 2 µm to 60 µm. The thickness is also referred to as "wet thickness" and relates to the state before removing the liquid constituents of the ink by drying. At a given target thickness (after removing the liquid constituents of the composition as explained above) and accordingly a given target sheet resistance and light transmission of the electroconductive layer to be prepared, the wet thickness may be the higher the lower the concentration of solid constituents in the composition is in the ink. The process of applying the ink is facilitated when there is no need to use a particular low wet thickness.

After applying the ink to the substrate, the layer which is formed by applying the ink is dried to remove solvent and to achieve a solid layer. The solid layer which is formed from the ink by drying preferably has a thickness in the range from 10 nm to 1000 nm, preferably from 50 nm to 500 nm.

The drying of the first layer preferably is carried out at a temperature in the range from 20 to 200° C. for 0.5 to 30 min. Particularly preferably the drying is carried out at a temperature in the range from 100 to 150° C. The duration of the drying process particularly preferably is in the range from 1 to 15 min.

The temperature at which the drying process is carried out depends on the solvent used, the melting point of the nanowires and the coating process. For silver nanowires, the upper limit is about 200° C. If a solvent is used which evaporates easily, a lower temperature, for example ambient temperature, can be used. On the other hand, a higher temperature for drying the layer has to be used in case the solvent does not evaporate at low temperatures or only a small amount of the solvent evaporates. To accelerate the drying process, the drying preferably is carried out at higher temperatures of at least 100° C. However, when the ink is applied to the substrate by roll-to-roll coating such as gravure printing, flexoprinting and slot-die coating, the drying of layers may be carried out in ambient conditions.

The duration of the drying process depends on the drying temperature. The duration is selected such that at the end of the drying process the residual moisture content in the ink is below a defined value. To achieve the desired residual moisture content, the duration of evaporation increases with decreasing temperature for the same solvent.

In case water is used as a solvent, generally the drying is carried out at a temperature in the range from 100 to 150° C. for a duration of 1 to 15 min. In some cases such as roll-to-roll coating, the drying can also be carried out in ambient temperature.

The atmosphere in which the drying is carried out is preferably selected such that no chemical reaction takes place between any component of the atmosphere and the ink. The atmosphere in which the drying of the first layer is carried out preferably comprises air, nitrogen or noble gases, for example argon. Particular preference is given to air or nitrogen.

Typically, the pattern comprises lines with lower conductivity and areas with higher conductivity which are surrounded by the lines with lower conductivity. The width of the lines with lower conductivity preferably is in the range from 10 to 1000 µm, particularly in the range from 50 to 500 µm.

To form the patterned conductive film comprising areas with lower conductivity and areas with higher conductivity, the mixture comprising the insulating coating material or the precursor of the insulating coating material is applied on the first layer. The insulating coating material penetrates into the first layer and forms an insulating coating around the electrically conductive nanoobjects. Thereby the areas with lower conductivity are formed.

The insulating coating material thereby preferably is selected from the group consisting of insulating oxides and insulating polymers. In case a precursor is used, the precursor is selected such that it penetrates into the first layer and transforms into the insulating coating material while enclosing the electrically conductive nanoobjects. If the transformation of the precursor is result of a chemical reaction, the mixture which comprises the precursor additionally comprises all components which are necessary to perform the chemical reaction for forming the insulating coating.

Suitable insulating oxides are for example $SiO_2$, $Al_2O_3$, $ZrO_2$ and zirconium silicate. Suitable insulating polymers are for example polystyrene, polyethylene, graphene oxide and fluorinated polyimide. Particularly preferred as insulating oxide is $SiO_2$.

In case $SiO_2$ is used as insulating coating material, in step (c) a mixture comprising a precursor of the $SiO_2$ is applied. Suitable precursors which form an insulating coating of $SiO_2$ are for example silicon alkoxides or water glass. Particularly preferred as precursor is tetraethyl orthosilicate (TEOS).

To achieve a mixture which can be applied onto the first layer and which allows forming of an insulating coating around the electrically conductive nanoobjects, in case of silicon alkoxides as precursor, the precursor is mixed with a catalyst such as ammonium hydroxide or ammonium fluoride and a mixed solvent containing water and a second solvent that is miscible with both silicon alkoxides and water. Suitable second solvent are for example alcohol or acetone, preferably isopropyl alcohol.

To achieve a mixture which can be applied onto the first layer and which allows forming of an insulating coating around the electrically conductive nanoobjects, in case of water glass as precursor, the precursor is mixed with water and an acidic catalyst such as hydrochloric acid.

In a preferred embodiment, the concentration of the insulating coating material or the precursor of the insulating coating material in the mixture comprising the insulating coating material or the precursor of the insulating coating material is in the range from 0.01 to 1 mol/l. Particularly preferred, the concentration of the insulating coating material or the precursor of the insulating coating material is in the range from 0.05 to 0.5 mol/l.

The insulating coating on the electrically conductive nanoobjects when using a precursor of the insulating coating material in step (c) is formed by transformation of the precursor into the insulating coating material by sol-gel-process, chemical vapour deposition, physical vapour deposition or atomic-layer deposition. Particularly in case the precursor is TEOS or water glass, the precursor is transformed into the insulating coating material by a sol-gel-process.

To apply the mixture comprising the insulating coating material or the precursor of the insulating coating material any suitable printing process or coating process can be used. Suitable coating processes are for example immersing, spin coating, draw down coating, roll-to-roll coating, gravure printing, microgravure printing, screen-printing, flexoprinting and slot-die coating. In case of immersing, a mask can be used to define patterns and protect the areas that are not to be coated by the insulating coating material.

After application of the mixture comprising the insulating coating material or the precursors of the insulating coating material, depending on the coating process, it is preferred to undergo a contact time to allow the insulating coating material to penetrate into the first layer and to coat the nanoobjects. In case a mixture with a precursor of the insulating coating material is applied and the insulating coating material is processed by a sol-gel-process, it is preferred to undergo a contact time of 0.5 min to 1 h, preferably of 1 min to 30 min and particularly of 1 min to 10 min.

After application of the mixture comprising the insulating coating material or the precursor of the insulating coating material and the contact time, when required, the coated substrate is rinsed and dried in step (d). The rinsing solvent is preferred to be the solvent used for the sol-gel process. The drying parameters of this drying step preferably correspond to those of the first drying in step (b), which means that the drying preferably is carried out at a temperature in the range from 20 to 200° C. for 0.5 to 30 min. Particularly preferably the drying is carried out at a temperature in the range from 100 to 150° C. The duration of the drying process particularly preferably is in the range from 1 to 15 min.

EXAMPLES

Manufacturing Example 1: Preparation of Silver Nanowire Films on Glass Substrates A styrene acrylic copolymer aqueous solution with 35 wt % solid content, available for example as Jonocryl® 60 by BASF SE, is diluted in water to a concentration of 20 wt %. A copolymer of 2-ethylhexyl acrylate methyl methacrylate, available as Acronal® LR9014 by BASF SE is diluted in water to a concentration of 10 wt %. A dispersion of 0.5 wt % silver nanowires in water, the diluted styrene acrylic copolymer aqueous solution and the diluted copolymer of 2-ethylhexyl acrylate methyl methacrylate are mixed in water so that the final concentration of the silver nanowires is 0.4 wt % and the mass ratio of styrene acrylic copolymer, copolymer of 2-ethylhexyl acrylate methyl methacrylate and nanowires is 4:3:3, respectively. The mixture is spin coated on glass substrate at 1000 rpm for 30 sec and dried for 5 min at 135° C. The sheet resistance is measured by a 4 point probe station (Lucas lab pro-4) and the optical properties are measured by BYK haze gard plus.

Manufacturing Example 2: Preparation of Silver Nanowire Films on Polycarbonate Substrates A styrene acrylic copolymer aqueous solution with 35 wt % solid content, available for example as Jonocryl® 60 by BASF SE, is diluted in water to a concentration of 20 wt %. A copolymer of 2-ethylhexyl acrylate methyl methacrylate, available as Acronal® LR9014 by BASF SE is diluted in water to a concentration of 10 wt %. A dispersion of 0.5 wt % silver nanowires in water, the diluted styrene acrylic copolymer aqueous solution and the diluted copolymer of 2-ethylhexyl acrylate methyl methacrylate are mixed in water so that the final concentration of the silver nanowires is 0.4 wt % and the mass ratio of styrene acrylic copolymer, copolymer of 2-ethylhexyl acrylate methyl methacrylate and nanowires is 4:3:3, respectively. The mixture is ball milled for 3 min to achieve homogenization. A conductive film is printed on an optical polycarbonate foil, for example commercially available under the product specification Makrofol® DE 1-1 175 µm from Bayer Material Science, using a draw-down bar with a wet thickness of 6 µm and a coating speed of 5 cm/sec and afterwards dried for 5 min at 135° C. The sheet resistance and optical properties have been measured as in manufacturing example 1.

Manufacturing Example 3: Preparation of Silver Nanowire Films on Glass Substrates A dispersion of silver nanowires in water with an amount of 0.5 wt-% silver nanowires and a solution of 1 wt-% hydroxypropyl methylcellulose (HPMC) in water are mixed in water so that the final concentration of the silver nanowires ins 0.2 wt-% and the mass ratio of HPMC and silver nanowires is 2:1, respectively. The mixture is spin coated on glass substrate at 1000 rpm for 30 sec and dried for 5 min at 135° C. The sheet resistance is measured by a 4 point probe station (Lucas lap pro-4) and the optical properties are measured by BYK haze gard plus.

Examples 1, 2, and 3: $SiO_2$-Coated Silver Nanowire Films on Glass Substrate

Under continuous magnetic stirring, 0.4 ml of 28% ammonia solution in water and various amounts of Tetraethyl orthosilicate (TEOS) were consecutively added to a mixture of 20 ml of Isopropyl alcohol and 4 ml of water. Silver nanowire films on glass substrate produced according to manufacturing example 1 are immersed into this solution for a certain amount of time thereby forming a $SiO_2$ coating on the nanowires, rinsed by deionized water and dried for 5 min at 135° C. The sheet resistance and optical properties before and after the coating with $SiO_2$ are measured as in manufacturing example 1. The results are shown in table 1. Examples 1 and 2 show the results for different immersion times with the same amount of TEOS, example 3 is a comparative example without TEOS. In table 1 "$R_{sh}$" means Sheet resistance, "T" means transmittance and "H" haze. "before" indicates the measuring of the substrate coated with a silver nanowire film before coating with SiO$_2$ and "after" indicates the measuring after coating with SiO$_2$.

TABLE 1

| Example | TEOS amount (ml) | Immersion time (min) | Rsh before (OPS) | Rsh after (OPS) | T before (%) | T after (%) | H before (%) | H after (%) |
|---|---|---|---|---|---|---|---|---|
| 1 | 0.36 | 10 | 78 ± 10 | 219 ± 36 | 92.2 | 92.4 | 1.03 | 0.75 |
| 2 | 0.36 | 30 | 82 ± 9 | ∞ | 92.1 | 92.5 | 1.05 | 0.59 |
| 3 | 0 | 10 | 95 ± 14 | 84 ± 24 | 92.2 | 92.2 | 1.17 | 1.29 |

From the examples can be seen that a longer immersion time with the same concentration of TEOS results in a much higher sheet resistance of the coated film. On the other hand, the immersion in an ammonia solution without TEOS shows no difference in sheet resistance. Further, coating with SiO$_2$ does not have any effect on the transmittance of the patterned conductive film and the haze only has slightly lower values.

Examples 4, 5: SiO$_2$-Coated Silver Nanowire Films on Polycarbonate Substrate

Under continuous magnetic stirring, 0.4 ml of 28% ammonia solution in water and various amounts of Tetraethyl orthosilicate (TEOS) were consecutively added to a mixture of 20 ml of Isopropyl alcohol and 4 ml of water. On strips of silver nanowire films on polycarbonate substrate produced according to manufacturing example 2, fast drying silver paste was painted on the two ends as contact pads. The center region of strips is then immersed into the solution for 30 min, rinsed by deionized water and dried for 5 min at 135° C. The resistance between two silver contact pads before and after coating with SiO$_2$ is measured by a Keithley source meter. The results are shown in Table 2, wherein example 5 is a comparative example. As in table 1 "R$_{sh}$" means the sheet resistance and "before" and "after" indicate the measurements before and after coating with the TEOS comprising solution.

In this example, the silver contact pads are placed outside the SiO$_2$-coated region to show whether the electron flow is stopped across the SiO$_2$-coated region.

TABLE 2

| Example | TEOS amount (ml) | Immersion time (min) | Rsh before (OPS) | Rsh after (OPS) |
|---|---|---|---|---|
| 4 | 0.36 | 30 | 393 | ∞ |
| 5 | 0 | 30 | 503 | 592 |

Example 6: SiO$_2$-Coated Silver Nanowire Films on Glass Substrate

Under continuous magnetic stirring, 0.4 ml of 28% ammonia solution in water and various amounts of Tetraethyl orthosilicate (TEOS) were consecutively added to a mixture of 20 ml of Isopropyl alcohol and 4 ml of water. Silver nanowire films on glass substrate produced according to manufacturing example 3 are immersed into this solution for 30 minutes thereby forming a SiO$_2$ coating on the nanowires, rinsed by deionized water and dried for 5 min at 135° C. The sheet resistance and optical properties before and after the coating with SiO$_2$ are measured as in manufacturing example 6. The results are shown in table 3. In table 3 "R$_{sh}$" means Sheet resistance, "T" means transmittance and "H" haze. "before" indicates the measuring of the substrate coated with a silver nanowire film before coating with SiO$_2$ and "after" indicates the measuring after coating with SiO$_2$.

TABLE 3

| Example | TEOS amount (ml) | Immersion time (min) | Rsh before (OPS) | Rsh after (OPS) | T before (%) | T after (%) | H before (%) | H after (%) |
|---|---|---|---|---|---|---|---|---|
| 6 | 0.36 | 30 | 129 ± 8 | ∞ | 92.4 | 94.2 | 0.47 | 0.52 |

The invention claimed is:

1. A transparent conductive film comprising a pattern of areas having higher conductivity and areas having lower conductivity, relative to one another, wherein:
    the conductive film comprises a binder matrix and nanoobjects disposed in the binder matrix;
    the areas with higher conductivity do not comprise an insulating coating material, and the nanoobjects are interconnected and electrically conductive;
    the areas with lower conductivity comprise an insulating coating material which forms around and encloses the interconnected nanoobjects and reduces electron transfer between said nanoobjects, wherein the as-coated nanoobjects are unbroken; and
    the nanoobjects have the same identity and the same three external nanoscale dimensions in the areas of higher and lower conductivity, and the nanoobjects are present in the film in substantially the same number density in each of the areas of higher and lower conductivity.

2. The transparent conductive film according to claim 1, wherein the insulating coating material is selected from the group consisting of an insulating oxide, a complex insulating oxide and an insulating polymer.

3. The transparent conductive film according to claim 2, wherein the insulating coating material comprises an insulating oxide selected from the group consisting of SiO$_2$, Al$_2$O$_3$, ZrO$_2$ graphene oxide and zirconium silicate.

4. The transparent conductive film according to claim 2, wherein the insulating coating material comprises an insulating polymer selected from the group consisting of polystyrene, polyethylene and fluorinated polyimide.

5. The transparent conductive film according to claim 1, wherein the nanoobjects are nanowires or nanotubes.

6. The transparent conductive film according to claim 1, wherein the nanoobjects comprise silver, copper, gold, platinum, palladium, nickel or carbon.

7. The transparent conductive film according to claim 1, wherein the nanoobjects have a diameter in the range from 1 to 100 nm and a length in the range from 1 to 500 µm.

8. The transparent conductive film according to claim 1, wherein a difference in haze of the areas with lower conductivity and areas with higher conductivity is less than 0.5%.

9. A process for producing a patterned transparent conductive film according to claim 1, comprising:
 (a) applying an ink comprising electrically conductive nanoobjects and a binder on a substrate, thereby forming a first layer, wherein the amount of conductive nanoobjects is such that the first layer is conductive after drying;
 (b) drying the first layer;
 (c) applying a mixture comprising an insulating coating material or a precursor of an insulating coating material on parts of the first layer that will form the areas with lower conductivity, wherein the insulating coating material or the precursors form an insulating coating around the electrically conductive nanoobjects; and
 (d) rinsing and drying the coated substrate.

10. The process according to claim 9, wherein the electrically conductive nanoobjects are nanowires or nanotubes.

11. The process according to claim 9, wherein the electrically conductive nanoobjects comprise silver, copper, gold, platinum, palladium, nickel or carbon.

12. The process according to claim 9, wherein the electrically conductive nanoobjects have a diameter in the range from 1 to 100 nm and a length in the range from 1 to 500 µm.

13. The process according to claim 9, wherein the ink comprising electrically conductive nanoobjects comprises from 0.01 to 0.5 wt-% electrically conductive nanoobjects, and from 0.02 to 2.5 wt-% binder and solvent.

14. The process according to claim 13, wherein the solvent is selected from the group consisting of water, an alcohol, a ketone, an ether, a hydrocarbon and an aromatic solvent.

15. The process according to claim 9, wherein the ink comprising conductive nanoobjects and binder is applied by spin coating, draw down coating, roll-to-roll coating, gravure printing, microgravure printing, screen-printing, flexoprinting or slot-die coating.

16. The process according to claim 9, wherein the ink comprising the electrically conductive nanoobjects is applied such that a wet thickness of the first layer is in the range from 100 nm to 40 µm.

17. The process according to claim 9, wherein the drying in (b) and the drying in (d) each are carried out independently at a temperature in the range from 20 to 200° C. for 0.5 to 30 min.

18. The process according to claim 9, wherein the insulating coating material is selected from the group consisting of an insulating oxide, a complex insulating oxide and an insulating polymer.

19. The process according to claim 18, wherein the insulating coating material comprises an insulating oxide selected from the group consisting of $SiO_2$, $Al_2O_3$, $ZrO_2$ and zirconium silicate.

20. The process according to claim 18, wherein the insulating coating material comprises an insulating polymer selected from the group consisting of polystyrene, polyethylene, and fluorinated polyimide.

21. The process according to claim 9, wherein the insulating coating material is $SiO_2$ and the precursor of the insulating coating material is silicon alkoxide or water glass.

22. The process according to claim 9, wherein the concentration of the insulating coating material or the precursor of the insulating coating material in the mixture comprising the insulating coating material or the precursor of the insulating coating material is in the range from 0.01 to 0.5 mol/l.

23. The process according to claim 9, wherein the mixture comprises a precursor of the insulating coating material in (c), and the precursor is transformed into the insulating coating material to form the insulating coating by a sol-gel-process, chemical vapor deposition, physical vapor deposition or atomic-layer deposition.

24. The process according to claim 9, wherein the mixture in (c) is applied by immersing, spin coating, draw down coating, roll-to-roll coating, gravure printing, microgravure printing, screen-printing, flexoprinting or slot-die coating.

* * * * *